United States Patent [19]
Picardi et al.

[11] Patent Number: 5,891,205
[45] Date of Patent: Apr. 6, 1999

[54] CHEMICAL MECHANICAL POLISHING COMPOSITION

[75] Inventors: S. Charles Picardi, Hatfield, Pa.; Mitch Mircea Tanase, Pennsauken, N.J.

[73] Assignee: EKC Technology, Inc., Hayward, Calif.

[21] Appl. No.: 911,076

[22] Filed: Aug. 14, 1997

[51] Int. Cl.$^6$ ........................................................ B24D 3/34
[52] U.S. Cl. ................................. 51/308; 51/309; 106/3; 252/79.1
[58] Field of Search ................................... 106/3; 51/309, 51/308; 252/79.1; 438/693

[56] References Cited

U.S. PATENT DOCUMENTS

| | | | |
|---|---|---|---|
| 4,057,939 | 11/1977 | Basi | 106/3 |
| 5,128,081 | 7/1992 | Siegel et al. | 264/81 |
| 5,460,701 | 10/1995 | Parker et al. | 204/164 |
| 5,476,606 | 12/1995 | Brancaleoni et al. | 252/79.1 |
| 5,480,476 | 1/1996 | Cook et al. | 106/3 |
| 5,514,349 | 5/1996 | Parker et al. | 422/186.21 |
| 5,575,837 | 11/1996 | Kodama et al. | 106/3 |
| 5,733,819 | 3/1998 | Kodama et al. | 438/693 |

OTHER PUBLICATIONS

K. Pak, et al., A CMP Process Using a Fast Oxide Slurry, Feb. 13–14, 1997, CMP–MIC Conference, pp. 299–306.

Borba, M. et al., "Effect of Oxide CMP Slurry Properties on Polishing Performance", no date.

*Primary Examiner*—Deborah Jones
*Attorney, Agent, or Firm*—Seidel, Gonda, Lavorgna & Monaco, PC

[57] ABSTRACT

A chemical mechanical polishing composition for polishing an oxide layer of a semiconductor device, the composition comprising an alkaline aqueous dispersion containing generally uniformly-shaped nanocrystalline particles of cerium oxide derived from a physical vapor synthesis process, generally uniformly-shaped particles of silicon dioxide, and wherein the cerium oxide particles are substantially the same or smaller in size and size distribution to the silicon dioxide particles. The ratio of the weight of the silicon dioxide in the composition to the weight of the cerium oxide in the composition is in the range from about 7.5:1 to about 1:1.

18 Claims, 4 Drawing Sheets

CHEMICAL MECHANICAL POLISHING COMPOSITION

BACKGROUND OF THE INVENTION

1. Technical Field

The invention is related to the general field of chemical-mechanical polishing compositions, and to the specific field of compositions for polishing and planarization during semiconductor fabrication.

2. Description Of The Related Art

A contemporary process of manufacturing semiconductor devices begins with a thin circular disc of silicon or other semi-conductive material, which forms a substrate upon which many individual semiconductor devices are fabricated. Such discs range in diameter from one inch to twelve or more inches, with the most common standard sizes being of five, six or eight inch diameters.

The fabrication involves the creation of minuscule integrated circuity in various alternating layers formed on the substrate disc. As layers are added to the substrate, it is common to refer to the built-up disc as a "wafer", and that terminology will be used in this description. To understand the role of chemical-mechanical polishing and planarization in this fabrication of wafers, it is sufficient to consider only the formation of an initial set of dielectric and conducting layers, with the understanding that complex devices may have many layers.

The silicon disc is coated with a layer of dielectric material, the more common materials being silicon oxides such as silicon dioxide ($SiO_2$), BPSG (boron phosphorous doped silicon glass), SOG (spun-on glass), TESO (tetraethylorthosilicate), and PETEOS (plasma enhanced tetraethylorthosilicate). Photolithography equipment is then used to create a circuitry pattern on the oxide layer. Precise application of the resist patterning is necessary for high-density micro-circuitry, and it is well known that the precision of current photolithography equipment is dependant upon the degree to which the oxide layer can be made flat (to provide uniform depth of focus and reduce other variables). Thus, various techniques have been devised for depositing the oxide layer evenly, and for etching or polishing the surface of the oxide layer to approach flatness or planarity. This invention is related to the polishing technique known generally as chemical-mechanical polishing ("CMP"). The term "polishing" as used herein, is intended to include planarization.

Chemical-mechanical polishing of semiconductor wafers at a commercial production rate is generally accomplished with rotational, linear or orbital polishing machines in which a wafer is pressed against a polish pad mounted on a moving platen in the presence of a CMP composition, or "slurry", between the pad and the wafer surface. The CMP slurry contains a chemical agent which is corrosive to the material to be removed, at a concentration which produces either an acidic or basic solution of sufficient pH to cause controlled surface dissolution on the material, and some type of abrasive particles to mechanically remove material from the surface. The combination of chemical and mechanical removal can generally produce more even removal at a higher rate than chemical etching or abrasive polishing alone. In addition, the CMP process produces a more "global" planarization across the wafer as opposed to the more local planarization of the chemical etch processes.

In addition to chemical-mechanical polishing to achieve uniform flatness in dielectric oxide layers, CMP compositions may be used for global planarization of a metal layer or layers on a semiconductor wafer. Metal layers (tungsten, copper, aluminum or various alloys) or metal-containing layers are applied over the patterned dielectric layer to form conductive regions in the fabrication of the semiconductor wafer. For example, the first dielectric layer described above may have been etched after photolithographic patterning to create patterns of holes and trenches corresponding to conductive interconnects and vias for that level in the semiconductor device. These holes and trenches will be filled with conductive material, usually by deposition of a metal or metal-containing layer or layers over the patterned dielectric. As an example of metal layering, the conductive material may be tungsten (W), which does not adhere strongly to silicon dioxide. To achieve better adherence, a thin seed layer (500–1000 angstroms) of titanium (Ti) is first applied to the patterned dielectric, then a second thin layer (500–1000 angstroms) of titanium nitride (TiN) is applied over the Ti layer to facilitate the bonding of the thicker tungsten layer.

The deposition of these metal layers involves covering the surface of the dielectric, not just filling the holes and trenches. To achieve complete filling of the holes and trenches with conducting material, it is usually necessary to deposit a relatively thick metal layer. However, to isolate conductivity in the wafer to the intended circuit patterns, it is necessary to remove the primary metal layer and any underlying seed and bonding metal layers until the wafer surface is free from metal except for the intended circuitry pattern. Then, a new layer can be deposited on the wafer. However, while removing the W/TiN/Ti metal layers, the CMP process should not erode too much of the exposed dielectric. The removal of the metal layers except for the circuitry pattern, and the leveling of the dielectric and metal surfaces, is often referred to as global planarization of the wafer. The ability of the CMP process to remove the higher regions of metal without removing an excessive amount of exposed lower regions of dielectric is often described as a "selectivity" of a CMP process. A CMP process may also demonstrate a selectivity for particular materials over other materials.

Many of the variables effecting CMP are known, and can be altered and balanced to achieve a desired level of performance for a particular polishing task or particular polishing tool. Changing any one of the factors to increase one aspect of performance often requires compromise in other areas of performance. For example, polishing rate can usually be enhanced by increasing down pressure and platen speed, but at the compromise of uniformity, surface defects and the potential for subsurface damage. Similarly, more aggressive pH levels and more abrasive particles in the slurry may increase removal rate at the compromise of planarization efficiency, selectivity, and the creation of scratches.

A principle objective of this invention is to improve the CMP slurries by the use of unique solid particles. Consequently, this background section will concentrate primarily on the properties of prior abrasive and activating solid particles, and on the effects previously attributed to particle parameters, with the understanding that the other variables must be considered when setting up any particular CMP process. However, the properties and performance of these unique solid particles are so different from particles made of the same precurser materials by other methods that most CMP applications would likely be improved by using these new particles.

As a general rule of thumb, it is considered that abrasives made of harder substances remove material faster than abrasives of softer material, all other factors being equal. However, it is also believed that harder abrasives are more prone to cause uneven removal at a given down pressure, and will increase the degree of surface scratching. Consequently, it has been somewhat common to select softer abrasive material such as silica, ceria, and germania to polish the dielectric oxide layers, and harder abrasives to planarize hard metal layers such as tungsten and titanium. In contrast, CMP slurries using the unique abrasive particles as described in this invention should enable the use of harder abrasive materials to achieve high removal rates even on oxides and softer metal layers such as copper and aluminum, without sacrificing uniformity of removal, selectivity, and freedom from scratching.

Similarly, it has been conventional wisdom that increasing the percentage weight of solids in the slurry increases removal rate, but that increasing the percentage of abrasive material will lower the selectivity between high and low regions. CMP slurries using these unique particles should enable the use of comparatively higher percentage weights of solids to achieve rapid removal rates without sacrificing selectivity.

There is some empirical data and theory that abrasive particle specific surface area is a significant factor in CMP polishing, and that decreasing specific surface area improves planarization efficiency and uniformity of removal. (See, *Effect of Oxide CMP Slurry Properties on Polishing Performance,* M. Borba et.al.). Since it was believed that the way to decrease surface area of the solid material is to increase the primary particle size, it was postulated that the trade-off for uniformity required a choice between a slurry with an increased weight percentage of large particles or a slurry with a lower weight percentage of small particles. In contrast, the unique particles described for use in this invention have such low porosity and such generally uniform shape that slurries having very low abrasive surface area can be obtained with a large number of very small particles.

Some abrasive particles are known to have a high degree of chemical activity toward certain substrate materials, such as cerium oxide ($CeO_2$) to silicon dioxide and other dielectric oxides. If such active material is used as the sole abrasive material in CMP slurry, high removal rate is achieved at the sacrifice of selectivity because the chemical dissolution takes place on all exposed portions of the substrate, regardless of relative height. Consequently, it has been attempted to use both $CeO_2$ particles and $SiO_2$ particles in a CMP slurry, but was found impractical because conventional $CeO_2$ particles could not be formed which match the size and shape of the extremely small $SiO_2$ particles used for critical polishing such as in semiconductor wafer fabrication. (See the discussion in the background section of U.S. Pat. No. 5,480,476, Cook et al). In contrast, the unique abrasive particles in this invention can be formed of $CeO_2$ with sizes equal to or smaller than the finest $SiO_2$ particles, and with a uniform shape and specific surface area similar to the finest $SiO_2$ particles.

It has also been known that regardless of how small the primary particles of abrasive can be made by conventional fuming processes, the primary particles tend to fuse together into irreversible branched chains called "aggregates", and that the larger order aggregates must be removed from the slurry in some manner to avoid scratching or other surface imperfections in the polishing process. In contrast, these unique abrasive particles do not fuse together to form aggregates, but rather remain as primary particles of generally uniform shape, and thus do not create the hazard of aggregate scratching.

These and other advantages of the invention should become more apparent from reading the summary and the detailed description of the invention which follow. However, these sections are intended to explain one or more ways or processes for making and using the invention to persons skilled in the art, including the best mode that is known to the inventor at this time. They are not intended, nor should they be used, to limit the scope of the invention. It is very likely that additional CMP slurries using one or more aspects of the invention will be developed for various polishing applications.

SUMMARY OF THE INVENTION

A chemical mechanical polishing composition for polishing an oxide layer of a semiconductor device, the composition comprising an alkaline aqueous dispersion containing generally uniformly-shaped nanocrystalline particles of cerium oxide derived from a physical vapor synthesis process and generally uniformly-shaped particles of silicon dioxide, wherein the cerium oxide particles are substantially the same or smaller in size and size distribution to the silicon dioxide particles.

In preferred embodiments, the ratio of the weight of the silicon dioxide in the composition to the weight of the cerium oxide in the composition is in the range from about 7.5:1 to about 1:1. In the most preferred embodiment, the cerium oxide is between 2% to 3% (weight) and the weight ratio of silicon dioxide to cerium oxide is about 5:1.

DETAILED DESCRIPTION OF THE INVENTION

Chemical mechanical polishing compositions, or slurries, according to the present invention involve the use of nanocrystalline, generally uniform-shaped primary particles as abrasives and/or solid form activants. As used in this specification, the term "nanocrystalline" refers to a crystallized substance having a crystalline grain size on the scale of 100 nanometers (0.1 micron) or smaller (1 nm=$10^{-9}$ m=0.001 micron).

The nanocrystalline particles employed in the present invention are formed by a physical vapor synthesis process essentially as described in U.S. Pat. Nos. 5,514,349 and 5,460,701. The physical vapor synthesis process generally involves the vaporization of a precursor material (e.g. aluminum, cerium, copper, etc.) to molecular or elemental form in a plasma arc, addition of a reactive gas (e.g. oxygen) to form molecular clusters (e.g. $CeO_2$, $Al_2O_3$, etc.) then condensation of the vaporized material to form minute primary particles or nanocrystals. In essence, the primary particles are built up from molecular levels, instead of being broken down from larger crystalline structures by traditional milling, fuming or precipitation processes. The growth of the resulting nanocrystalline primary particles can be regulated by process parameters to extremely small size and uniformity.

Figure 1:
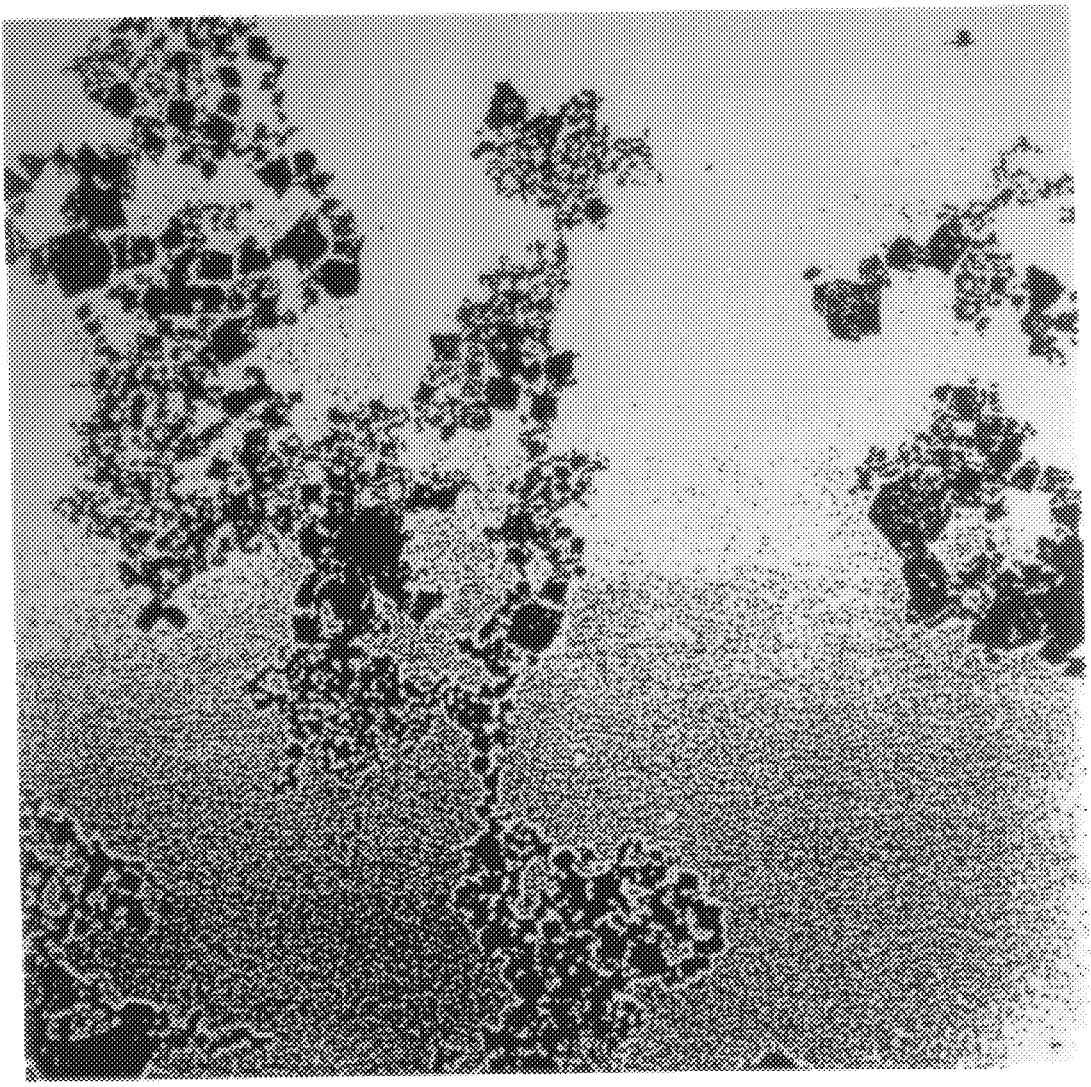
FIG. 1 is photomicrograph (TEM) of $CeO_2$ particles obtained by a physical vapor synthesis process.
Figure 2:
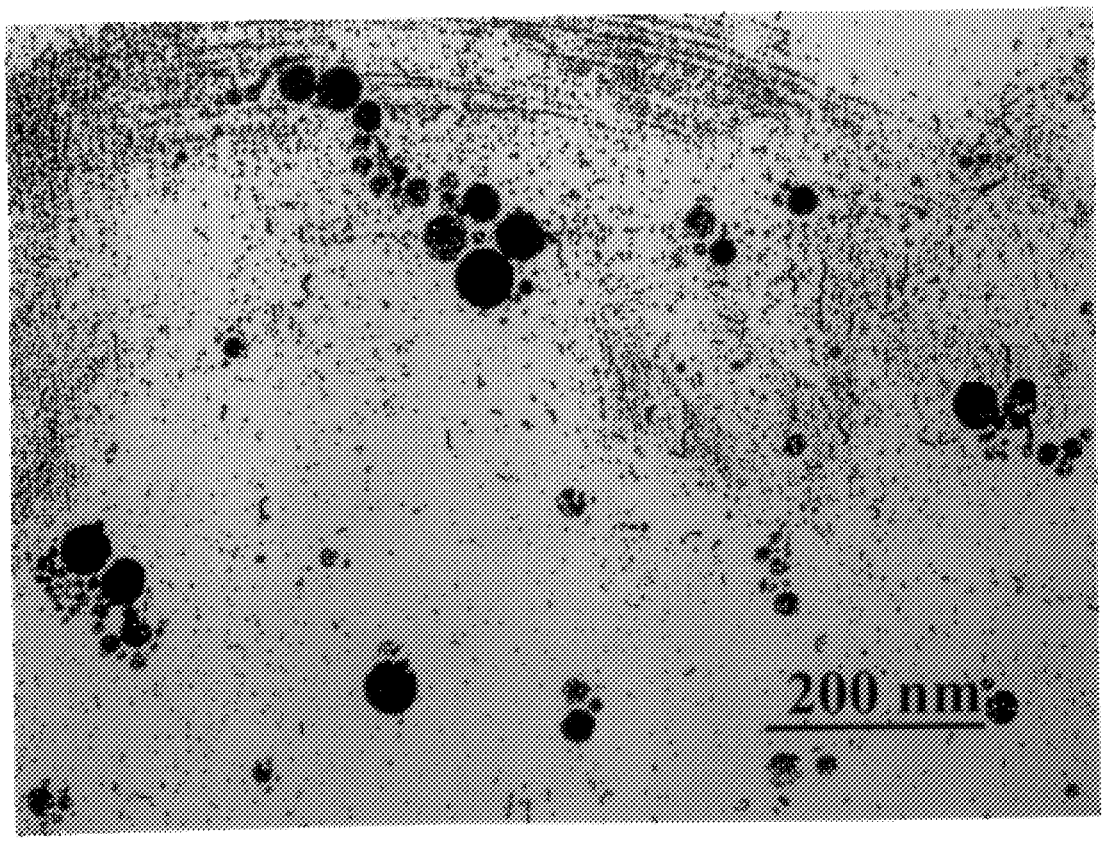
FIG. 2 is a photomicrograph (TEM) of $SiO_2$ particles obtained by a chemical precipitation process.
Figure 3:
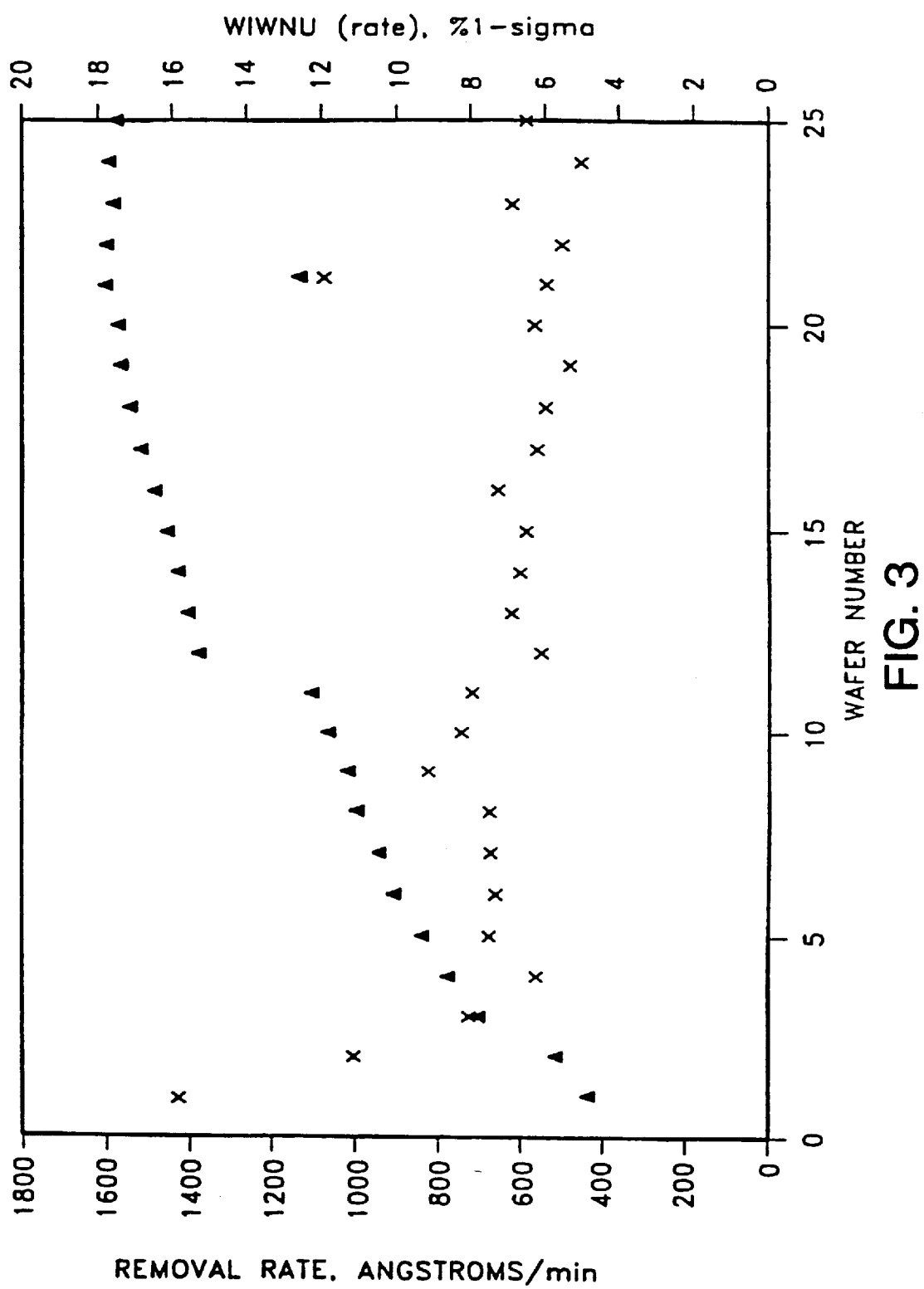
FIG. 3 is a graphical illustration of polishing performance results for an $SiO_2$ CMP composition.

In contrast to traditional milled or fumed particles, the nanocrystalline particles are of almost perfectly uniform geometry. FIG. 1 shows $CeO_2$ particles formed by a physical vapor synthesis process. $SiO_2$ particles formed by a chemical precipitation process are shown in FIG. 3. These nanocrystalline particles have considerably lower surface areas (porosity) and greater density than equivalent sized particles formed by other conventional methods, such as fuming or chemical precipitation methods. Moreover, in contrast to fumed particles, the nanocrystalline primary particles do not fuse together to form aggregates. The nanocrystalline particles formed by a physical vapor synthesis process can also be essentially free of contaminants, and have a high uniformity of crystalline phase. For example, nanocrystalline alumina particles with greater than ninety percent gamma phase structure can be formed in a physical vapor synthesis process.

Composition for Oxide Layer Polishing:

A composition according to the present invention which is intended for polishing an oxide layer of a semiconductor device involves nanocrystalline primary particles of cerium oxide ($CeO_2$) combined in dispersion with particles of silicon dioxide ($SiO_2$). The term "polishing", as used herein, includes planarization. Cerium oxide may also be referred to as ceria, ceric oxide, or cerium dioxide.

The $CeO_2$ employed in this invention is in the form of generally uniform-shaped (generally cubic) nanocrystalline primary particles ranging in size from about 1 nm to about 50 nm. The $CeO_2$ used in this particular composition has an mean equivalent diameter of about 10–14 nm (equivalent diameter is used herein to indicate the diameter of a sphere which would just enclose the generally cubic-shaped nanocrystalline particle). The $CeO_2$ was purchased in powder form from Nanophase Technologies Corporation under the trade name Nanotek® cerium oxide.

The $SiO_2$ (silicon dioxide or "silica") used in this composition may be a colloidal silica. Colloidal silica is preferred to fumed silica in that fumed silica will contain aggregates of fused particles which may produce scratch arcs on the layer being polished. The colloidal $SiO_2$ used in the invention is in the form of generally spherical particles having a mean equivalent particle diameter below 50 nm, and preferably about 35 nm to about 40 nm. The colloidal $SiO_2$ used in the particular compositions described below has a mean equivalent particle diameter of 37.5 nm, and was purchased as a concentrated CMP composition from Dupont under the trade name SYTON® HT 50, which is a 50% weight $SiO_2$ suspension in deionized water, a dispersant and an alkali additive. SYTON® HT 50 is recommended to be diluted approximately 15:1 for use. Although it has not yet been tested, the $SiO_2$ particles could also be in the form of generally uniform-shaped nanocrystalline primary particles formed in a physical vapor synthesis process, in which case the particle size may be reduced well below 50 nm.

A significant aspect of this CMP composition is the size relationship of the nanocrystalline $CeO_2$ primary particles to the $SiO_2$ primary particles. Unlike conventional forms of $CeO_2$, the nanocrystalline particles are substantially the same size as or smaller than colloidal $SiO_2$. Moreover, the nanocrystalline $CeO_2$ particles, like the colloidal $SiO_2$ particles, are in the form of non-aggregated primary particles, and the shape of the particles of both materials is essentially a uniform solid (generally spherical for the $SiO_2$ and generally cubic for the $CeO_2$) This matching of the particle parameters is believed to allow the $CeO_2$ particles to function as an activator to the oxide layer and simultaneously contribute to mechanical removal, without producing the detrimental scratch arcs that would be an inherent hazard of the larger and irregular-shaped conventionally prepared $CeO_2$.

A chemical mechanical polishing composition according to the present invention was formulated by dispersing the Nanotek® cerium oxide powder in deionized water into a 20% (weight) $CeO_2$ dispersion. The dispersing process included a mechanical milling operation (Netzsch mill) to de-agglomerate the $CeO_2$ powder to below 500 nm agglomerate diameter as measured by a Horiba LA900 instrument. The $CeO_2$ dispersion was then mixed with SYTON® HT 50 and additional deionized water to create a slurry with a 10% weight percentage of $SiO_2$, a 2.5% weight percentage of $CeO_2$, and 88% of deionized water. (It is expected that effective slurry could be formulated having $SiO_2$ in the range from about 5% to about 15%, but most preferably about 10%; and weight percentage of $CeO_2$ from about 2% to about 5%, most preferably 2.5%.) The weight ratio of silicon dioxide to cerium oxide in the slurry may be in the range from about 7.5:1 to about 1:1, most preferably 4:1.

At present, compositions containing 2%, 2.5%, and 5% (weight) $CeO_2$ have been made. However, it is hypothesized that increasing or decreasing the concentration of $CeO_2$ in the composition will have the effect of proportional increase or decrease in removal rates only until an "effectiveness plateau" is reached, wherein additional $CeO_2$ will not cause a correspondingly significant increase in removal. A 3% (weight) $CeO_2$ concentration may be at or near the plateau.

The performance of this CMP composition containing a 4:1 ratio of $SiO_2$ particles to nanocrystalline $CeO_2$ particles for oxide layer polishing was tested by comparing the removal rates and resulting surface uniformities on PETEOS against a CMP slurry containing only $SiO_2$ as an abrasive particle. The two examples described below illustrate the comparison. Unless otherwise specified, all expressions of percent concentrations are based on weight.

An IPEC 472 polishing machine was employed for both examples. Twenty-five (25) six-inch semiconductor wafers containing a PETEOS layer were subjected to polishing using a 15% $SiO_2$ composition (Example 1) and another 25 six-inch semiconductor wafers containing a PETEOS layer were subjected to polishing using the 2.5% $CeO_2$ and 10% $SiO_2$ composition (Example 2). Other relevant conditions and parameters are set forth in the discussion for each example.

For each wafer polished, an average removal rate (expressed in angstroms/min) was derived from pre- and post-polish film thicknesses using a multi-site measurement. For each wafer polished, a WIWNU (within wafer non-uniformity) value was calculated with a PROMETRIX UV-1280SE utilizing 42 reference points on the wafer surface with an edge-exclusion of 6 mm. WIWNU is a measure of how uniform the removal is across the wafer, and is expressed as a percentage of non-uniformity within one standard deviation.

The polishing conditions for these examples were as follows:

| | |
|---|---|
| Platen Temperature | 110 degrees F. |
| Platen Speed | 40 rpm |
| Carrier (Wafer) Speed | 40 rpm |
| Back Pressure | 0 psi |
| Slurry Flow | 225 ml/min |
| Polish Pad | IC 1400 K-groove |
| Carrier Film | R200T3 |
| Pad Conditioning | Concurrent |

EXAMPLE 1

Figure 4:
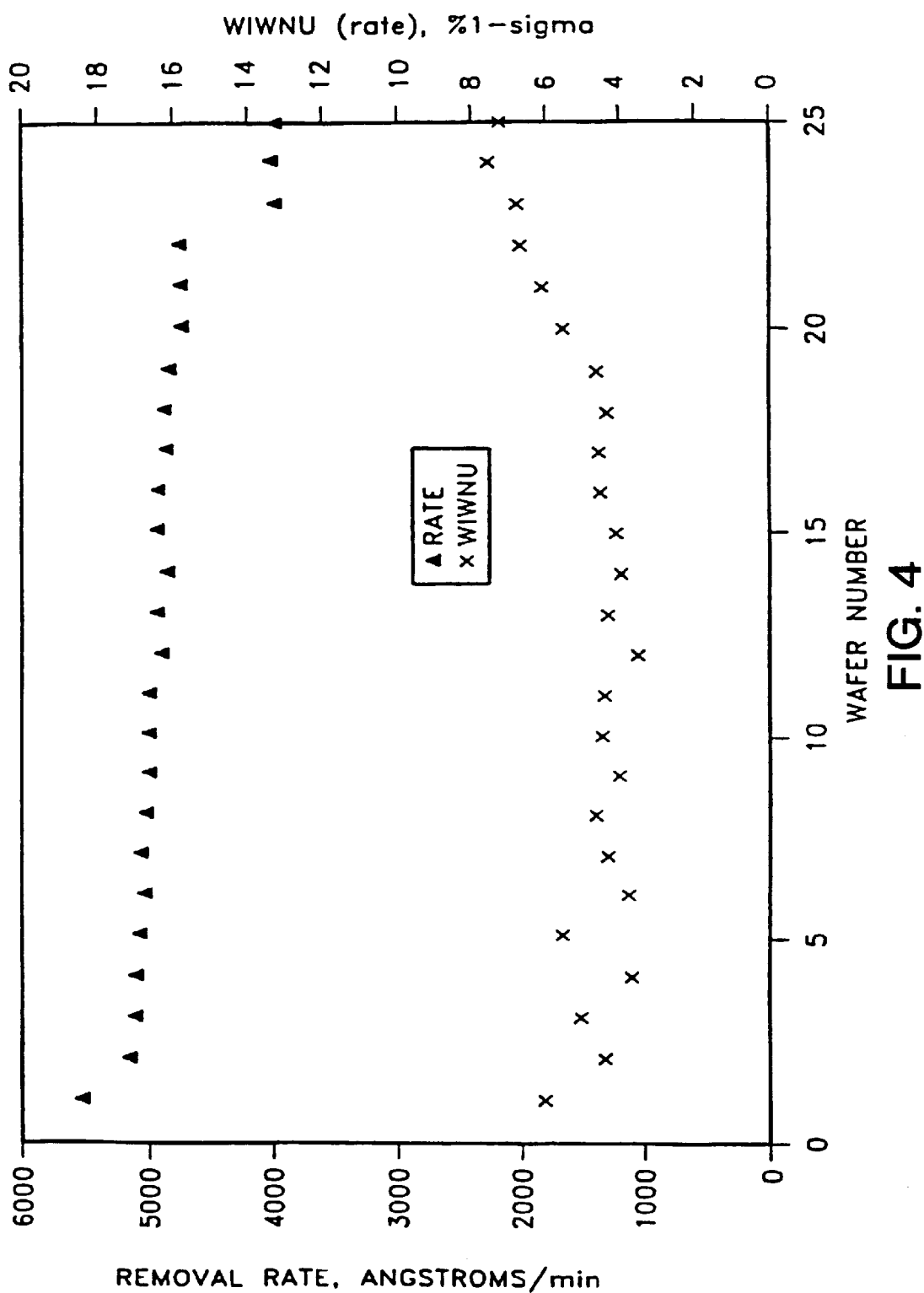
FIG. 4 is a graphical illustration of polishing performance results for a $CeO_2/SiO_2$ CMP composition.

The results of the polishing are graphically illustrated in FIG. 4. According to the graph, the removal rate steadily increased until leveling out at about 1600 angstroms/min. A step increase in removal rate between wafers 11 and 12 is attributed to increasing polishing pad pressure from 7 psi (wafers 1–11) to 9 psi (wafers 12–25). Because the polishing pad takes time to become "charged" or fully saturated with CMP slurry, the removal rate generally increased until leveling out at around wafer no. 20. The WIWNU value steadily decreased as the pad became charged. The final conditions, believed to approximate steady state, were a removal rate of about 1500–1600 angstroms/min. and a WIWNU corresponding to between about 6.5% and 5.5%.

EXAMPLE 2

The polishing pad was not changed after completion of example 1. The polishing conditions were the same as set forth in Example 1.

The results for this protocol are graphically illustrated in FIG. 5. Wafers no. 1–22 were subjected to a pad pressure of 9 psi and wafer nos. 23–25 were subjected to 7 psi pad pressure. The removal rate for wafer nos. 1–22 was generally constant at about 5000 angstroms/min. The WIWNU value for wafer nos. 1–22 generally fluctuated between 3.5% and 5.0%, with an average of about 4.0%.

In comparing the results of both examples above, it can be seen that the CMP composition of example 2 (10% $SiO_2$/2.5% $CeO_2$) enabled a polishing removal rate approximately 213% faster than the CMP composition of example 1 (15% $SiO_2$), even though the total solids by weight were less in example 2 and the quantity by weight of $SiO_2$ abrasive was reduced by one-third. The WIWNU value similarly showed significant improvement in example 2, in that the $CeO_2$/$SiO_2$ combination facilitated an approximate 33% decrease in surface non-uniformity.

The reasons for the significant increase in performance of the $CeO_2$/$SiO_2$ composition can only be hypothesized. It is generally believed that the $CeO_2$ has an activating effect on the $SiO_2$, enhancing its ability to interact with the non-metallic layer of the semiconductor. The $CeO_2$ may participate in the acid-base chemistry characteristic of the surface interactions between $SiO_2$, the alkali additive, and the oxide layer being polished. This chemical activation is suggested in part by the "plateau" effect described above, wherein adding more $CeO_2$ does not produce a comparable increase in polishing rate. However, it is also believed that nanocrystalline $CeO_2$ primary particles also contribute to the mechanical polishing in a manner similar to the $SiO_2$ particles. This is why the conventional fumed cerium particles are prone to produce scratch arcs. Thus, in the present invention, the physical (mechanical) benefits of uniformly-shaped, non-aggregated nanocrystalline ceria particles is coupled with ceria's activating effect on $SiO_2$ and related oxides, without deleterious scratch hazard.

Although the embodiments described above are cerium/silicon dioxide compositions for planarization of oxide layers, other CMP compositions may be formed using other generally uniformly-shaped nanocrystalline particles derived from a physical vapor synthesis process, such as copper oxides or other metal oxides as the abrasive particles. In addition, it may be possible to form other CMP compositions in which the oxidizer agent is formed as a generally uniformly-shaped nanocrystalline particles derived from a physical vapor synthesis process.

Consequently, the scope of the invention should determined by reading the claims which follow.

We claim:

1. A chemical mechanical polishing composition for polishing an oxide layer of a semiconductor device, comprising:

an alkaline aqueous dispersion containing particles of cerium oxide and particles of silicon dioxide, wherein the cerium oxide particles are generally uniformly-shaped nanocrystalline particles derived from a physical vapor synthesis process.

2. A composition as in claim 1, wherein the cerium oxide particles have a mean equivalent particle diameter of less than about 50 nm.

3. A composition as in claim 1, wherein the cerium oxide particles have a mean equivalent particle diameter of less than about 25 nm.

4. A composition as in claim 1, wherein the cerium oxide particles have a mean equivalent particle diameter of less than about 15 nm.

5. A composition as in claim 2, wherein the silicon dioxide particles are primary particles produced by a chemical precipitation process and have an essentially spherical shape with a mean equivalent diameter of less than about 50 nm.

6. A composition as in claim 3, wherein the silicon dioxide particles are primary particles produced by a chemical precipitation process and have a mean equivalent diameter of less than about 40 nm.

7. A composition as in claim 4, wherein the silicon dioxide particles are primary particles produced by a chemical precipitation process and have a mean equivalent diameter of less than about 40 nm.

8. A composition as in claim 1, wherein the ratio of the weight of the silicon dioxide in the composition to the weight of the cerium oxide in the composition is in the range from about 7.5:1 to about 1:1.

9. A composition as in claim 2, wherein the ratio of the weight of the silicon dioxide in the composition to the weight of the cerium oxide in the composition is in the range from about 7.5:1 to about 1:1.

10. A composition as in claim 3, wherein the ratio of the weight of the silicon dioxide in the composition to the weight of the cerium oxide in the composition is in the range from about 7.5:1 to about 1:1.

11. A chemical mechanical polishing composition comprising an aqueous dispersion containing:

a) generally uniformly-shaped nanocrystalline particles of cerium oxide derived from a physical vapor synthesis process;

b) generally uniformly-shaped particles of silicon dioxide; and c) wherein the cerium oxide particles are substantially the same size as or smaller in size than the silicon dioxide particles.

12. A composition as in claim 11, wherein cerium oxide particles and the silicon dioxide particles are predominantly non-aggregated primary particles.

13. A composition as in claim 11, wherein the ratio of the weight of the silicon dioxide in the composition to the weight of the cerium oxide in the composition is in the range from about 7.5:1 to about 1:1.

14. A composition as in claim 12, wherein the ratio of the weight of the silicon dioxide in the composition to the weight of the cerium oxide in the composition is in the range from about 7.5:1 to about 1:1.

15. A composition as in claim 14, wherein the amount of cerium oxide in the composition is between about 2% to about 3% percent by weight.

16. A composition as in claim 11, wherein the amount of cerium oxide in the composition is between about 2% to about 3% percent by weight, and the ratio by weight of the silicon dioxide to the cerium oxide in the composition is about 4:1.

17. A composition as in claim 11, wherein the cerium oxide particles and the silicon dioxide particles have a mean equivalent diameter of less than about 40 nm.

18. A composition as in claim 16, wherein the cerium oxide particles and the silicon dioxide particles have a mean equivalent diameter of less than about 40 nm.

* * * * *